Nov. 7, 1967 H. T. ADKINS ETAL 3,351,762

VERY CLOSE DIFFERENTIAL OUTDOOR LIGHTING CONTROL

Filed July 6, 1964

INVENTORS
ROBERT H. PIERCE
HAROLD T. ADKINS
BY
McGlew and Toren
ATTORNEYS

United States Patent Office 3,351,762
Patented Nov. 7, 1967

3,351,762
VERY CLOSE DIFFERENTIAL OUTDOOR LIGHTING CONTROL

Harold T. Adkins, Hanover, and Robert H. Pierce, Duxbury, Mass., assignors to Sigma Instruments, Inc., a corporation of Massachusetts Filed July 6, 1964, Ser. No. 380,363
12 Claims. (Cl. 250—206)

ABSTRACT OF THE DISCLOSURE

The disclosure relates to means for controlling the sensitivity of response of an ambient light responsive circuit to changes in the ambient light levels and in accordance with an immediately preceding ambient light level of substantial duration. The sensitivity of response of a photosensitive cell controlling the light responsive circuit is reduced during a long period when the ambient light level is high, such as during daylight, and the sensitivity of response of the photosensitive cell is greatly increased following a long period when the ambient light level is relatively low, as during nighttime. Thereby, the photosensitive cell will act to close an artificial illumination circuit earlier, at dusk, and to open such circuit earlier at dawn.

Various means are disclosed for controlling the sensitivity of the photosensitive cell by modulating energy supplied to the cell, each of these means having an energy modulation effect which varies as a function of the duration of an immediately preceding ambient light level of substantial duration. In one embodiment, light incident upon the photosensitive cell enters through a window of a material whose opacity increases in accordance with the duration of relatively high light levels to which its is exposed.

In another embodiment of the invention, a positive temperature coefficient of response resistance is imbedded in heat insulating material and is connected in series with the photosensitive cell so that, when the photosensitive cell is conductive for a relatively long period, the effective resistance is substantially increased to decrease the electrical energy available through the photosensitive cell.

In a third embodiment of the invention, a thermistor is imbedded in heat insulating material in heat transfer relation with a resistance, this thermistor being connected in parallel with the photosensitive cell. In a fourth embodiment of the invention, a light source, such as an incandescent lamp or a gaseous conduction type of lamp, is operatively associated with the photocell, in light transfer relation therewith, and is connected in parallel with the photocell.

*Background of the invention*

This invention relates to light responsive electric circuits such as, for example, control circuits including a photocell, such as a resistance-type photocell, therein. More particularly, the present invention is directed to a novel ambient light responsive circuit including a photo sensitive cell controlling the same and with novel means for obtaining a very close differential between the turn-on and turn-off values while maintaining stability of the control.

A particular example of a light responsive control circuit is the control of artificial illumination by means of a photo sensitive cell such as, for example, a resistance-type photocell. In the late afternoon or evening, when the ambient light condition or level changes from relative brightness toward relative darkness, the relatively rapid decrease in light incident upon the photocell effects turning on of the artificial illumination. The reverse takes place in the early morning when the ambient light increases rather rapidly. Such control circuits are used, for example, to control outdoor light such as street lamps and the like.

With the general increasing brightness of artificial illumination, it is desirable to turn-on the lamps at higher ambient light values, or earlier in time. Correspondingly, since these artificial illumination devices consume considerable power, it is desirable to turn them off as early as possible in the morning, or with increasing ambient light level. In the particular case of mercury lamps, as long as five minutes is required for such lamps to warm up completely and attain full brilliance. Consequently, in this case, it is desirable to turn the mercury lamps on at an even earlier time.

It is always desirable to maintain the differential between the ambient light level required to turn-on artificial illumination and that required to turn-off artificial illumination at as small a value as possible. However, reducing the differential between the turn-on and turn-off ambient light conditions or levels makes the control less stable and more likely to oscillate with, for example, changes in cloud cover or changes in light fed back from an energized artificial light source.

An object of the present invention is to provide a control for artificial illumination in which the differential between the turn-on light level and the turn-off ambient light level is reduced to a very low value without affecting the stability of the control.

Another object of the invention is to provide a control for artificial illumination in which the sensitivity of the control is substantially reduced during one condition of ambient light level and substantially increased during an opposite condition of ambient light level.

A further object of the invention is to provide a control for artificial illumination including means operatively associated with a photocell and controlling the response thereof, to a change in ambient light condition or level, in accordance with an immediately preceding ambient light condition or level of substantial duration.

Yet another object of the invention is to provide a control for artificial illumination including memory means capable of storing or remembering a pre-existing condition and controlling, accordingly, the sensitivity of a photocell in the control circuit.

Still another object of the invention is to provide a control for artificial illumination, including a photo sensitive cell and of the type mentioned above, in which the control parts are simple in construction and have long useful lives.

The objectives of the invention may be obtained in various ways. In one embodiment of the invention, a photo sensor, such as a photo-resistance type cell, a photo diode, or other light sensitive device, is connected in circuit with a relay controlling artificial illumination devices. The light incident upon this photo sensor is made to pass through a window whose opacity varies in accordance with its exposure to light. More particularly, the window is made of a material, or contains material, which, during periods of relatively high light levels, becomes increasingly opaque and, with periods of relative darkness or in which a very low light level passes therethrough, regains its transparency. In other words, the material of the window may be said to be a material having a reversible light sensitivity, and this material may be glass, liquid, gas or plastic composition material. An advantage of this particular arrangement is that the window not only acts as a light modifier for the photo sensor, but protects the cell from high light levels.

Using a window of variable opacity or reversible light sensitive material, or containing such material, the window will darken or become opaque during periods of high ambient light levels and will thus decrease the light incident upon the photo sensor in the evening, since the previous light exposure of the window was of high intensity. This will decrease the transmittance of the window thereby operating the control relay at a higher ambient level or, in terms of time, sooner. The lens or window becomes transparent during the night, since its previous history would be of darkness over a period of several hours. Thus, in the morning, all of the ambient light is transmitted to the photo sensor to increase the response of the latter very rapidly and thus turn-off the artificial illumination devices at an earlier time.

In accordance with another embodiment of the invention, a resistor having a positive temperature coefficient of resistivity is connected in series with a photo-resistance cell and encased in a good heat insulating material. During the daylight hours, when the light incident upon the photocell causes the latter to act in the nature of a closed switch, the current flow through the positive temperature coefficient resistor is relatively high and the latter heats up over a period of several hours. The encasing of heat insulating material stores this heat within the resistor. In the evening, the ambient light decreases rather rapidly and the positive temperature coefficient of resistivity (PTCR) resistor has a high series resistance. This desensitizes the control circuit and the control relay is operated earlier than normal to turn-on the artificial illumination. During the night, the current through the photo-resistance cell is substantially zero and the PTCR resistor cools down to decrease its resistance and thus increase the sensitivity of the series controlled circuit. Thus, the artificial illumination is turned off earlier in the morning.

The foregoing arrangement can be made even more effective by providing a high heat storage metal mass within the heat insulation enclosing the PTCR resistor, thus obtaining even longer memories.

In a variation of the foregoing embodiment, a thermistor is arranged in shunt with a photo-resistance type cell, and a heating resistance, connected in series with the cell, is disposed in heat transfer relation with the thermistor within a casing of heat insulating material. The thermistor has a negative temperature coefficient of resistance. Thus, due to being heated by its heating resistance, which is arranged in thermally adjacent relation to the thermistor, the resistance of the thermistor is reduced very substantially during daylight hours when the photo-resistance cell is conductive and a relatively large current is flowing through the heating resistance. This in turn, decreases the sensitivity of the photo-resistance cell circuit and will turn-on the artificial illumination at an earlier hour. During the night, when the photo-resistance cell acts nearly as an open switch, there is substantially no current flow through the heating resistance. The thermistor thus tends to cool off and increase its resistance substantially. The substantial resistance thus in shunt or parallel with the photo-resistance cell results in the latter becoming more sensitive and thus turning off the artificial illumination at an earlier hour.

In still another embodiment of the invention, a lamp, such as incandescent lamp or a luminescent gas filled lamp, is connected in shunt with the photocell and so that its light is incident thereupon. This lamp acts as a light feedback arrangement for the photo-resistance cell. During daylight, when the photo-resistance cell is substantially fully conductive, there is insufficient current flow through the associated lamp to effectively illuminate the same. However, during the night hours, when the photo-resistance cell acts substantially as an open switch, the associated lamp is effectively illuminated and directs some light upon the photo-resistance cell. This, in turn, will cause the photo-resistance cell to operate sooner to turn-off the artificial illumination during the early morning hours. Thereby the differential between the turn-off ambient light value and the turn-on ambient light value is substantially reduced.

For an understanding of the present invention, reference is made to the following description of the typical embodiments thereof as illustrated in the accompanying drawings.

Figure 1:
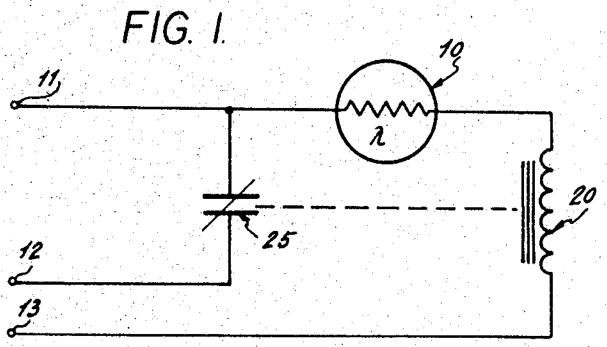
FIG. 1 is a schematic wiring diagram of one embodiment of the invention involving a photo-resistance cell having light incident thereupon directed through a window or lens which has a variable opacity.

In the accompanying drawings, those parts or components which are common to all embodiments of the invention have been given the same reference character. Also, and solely by way of example, the principles of the invention are illustrated as applied to a particular form of outdoor lighting control in which a photo-resistance cell is connected between a pair of input terminals in series with a relay having a pair of normally closed contacts; i.e. closed when the relay is dropped out or deenergized. These contacts control an energizing circuit for artificial illumination means. In the drawings, the parts are illustrated in the position which they occupy during night time or at a relatively low level or condition of ambient light.

Referring to FIG. 1, such an outdoor lighting control is illustrated as connected to a line terminal 11, a load terminal 12 and a neutral terminal 13. A photo-resistance cell 10 is connected, in series with the operating coil of a relay 20, between line terminal 11 and neutral terminal 13. It will be appreciated that both terminals 11 and 13 could be line terminals of opposite polarity although, in the usual case, a control circuit of the type illustrated is connected between one line terminal and a neutral or grounded terminal. Relay 20 has a pair of normally closed contacts 25 which are opened whenever relay 20 is dropped out or deenergized.

In the normal operation of a control such as shown in FIG. 1, cell 10 is highly conductive during daylight hours when the ambient light is at a relatively high level or a relatively high condition. There is thus sufficient current flow through relay 20 to energize the latter to open its contacts 25 and thus interrupt the supply circuit for the artifiicial illumination devices. When the ambient light level or condition decreases, as at the approach of evening, cell 10 becomes highly resistive and the current flow through relay 20 is insufficient for the latter to stay energized or transferred. Consequently, relay 20 closes its contacts 25 and thus energizes the circuit for the artificial illumination devices. It is desirable, as stated, to maintain the differential between the turn-on and turn-off values of the control circuit at as low a value as possible.

Figure 2:
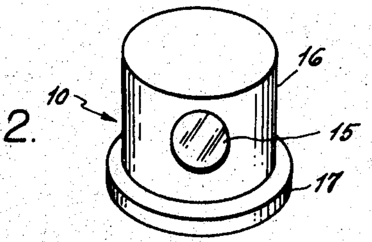
FIG. 2 is a perspective view of such photocontrol, illustrating the variable opacity window.

One manner of doing this is shown in FIG. 2 in which photocell 10 is enclosed within a housing 16 of opaque material mounted upon a base 17. Base 17 may be provided with prongs or connectors whereby it may be interchangeably interengaged with a socket or the like connected in series with relay 20. In accordance with the invention, all the light incident upon photocell 10 must pass through a window 15 which has a variable opacity. In particular, the opacity of window 15 increases with prolonged exposure to light, and the window becomes more transparent when there is no light passing therethrough. The changes are reversible and take place over relatively extended periods of time, such as several hours.

Window 15 may be constructed of a reversible light sensitive material or may embody reversible light sensitive material therein, as by being in the form of a hollow lens of transparent material having liquid, gaseous, or other reversible light sensitive material filling the interior of the hollow lens. Among materials which may be used for window or lens 15 are, by way of example, chlorophyl materials which grow and increase in size with light, and shrink during darkness; a sulphuric acid solution of ammonium molybdate, especially with organic substances such as lactic acid; molybdic acid and formic acid; ammonium molybdate treated with methanol or ethanol; molybdic acid oxalate and formate; $WO_3$ and $MoO_3$ dispersed on cellulose; molybdenum, tungsten and chromium hexacarbonyls in methyl methacrylate polymers; halides of silver, or any other material whose opacity is a function of its light history. As stated, such materials may be plastic composition materials, glass, liquids, or gases.

An arrangement of the photoresistance cell such as shown in FIGS. 1 and 2 remembers the preceding light level sufficiently to reduce or even to overlap the normal differential between turn-on and turn-off levels of outdoor lighting controls. Window 15 darkens or becomes opaque during periods of high ambient light levels. It decreases due to its previous light history and resulting increased opacity, the light falling on cell 10 in the evening and thus decreases the light transmittance and lessens the photocell current to deenergize relay 20 at a higher level of light or at an earlier time. During the night, the window, or lens, or shutter 15 gradually becomes more transparent since its previous history is one of darkness for several hours.

By morning, window 15 is relatively transparent so that most of the incident light is transmitted to the photocell, thus decreasing the resistance of the latter rapidly to turn-off the artificial illumination at an earlier hour, or at a lower ambient light level or condition. When the basic control circuit shown in FIG. 1 has a reasonably close differential to start with, and when the range of shuttering effected by the variable opacity window 15 is relatively large and the memory is relatively long or over a long period, then the control circuit may turn the lights on at an ambient light value of the order of 10 foot candles and turn the light off at an ambient light value of the order of 2 foot candles. These values would be substantially impossible, as a practical matter, without the variable opacity window lens or shutter shown in FIG. 2 as interposed in the path of light directed toward photocell 10.

It should be understood that such a variable opacity window 15 can be used with photosensors other than photoresistance cells, such as photo diodes, photovoltaic generating cells and the like.

Figure 3:
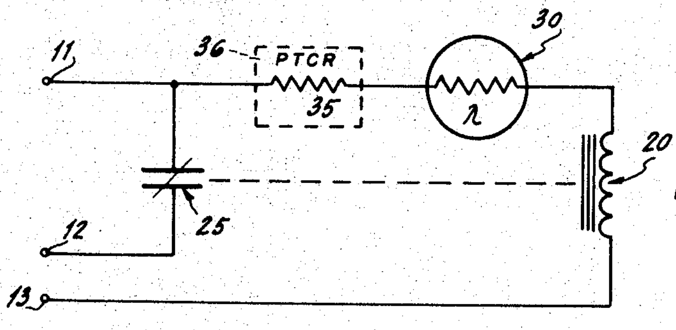
FIGS. 3, 4 and 5 are schematic wiring diagrams illustrating further embodiments of the invention.

Another embodiment of the invention is shown in FIG. 3. Referring to FIG. 3, the overall circuit is the same as shown in FIG. 1, but due to the fact that the photoresistance cell is no longer provided with a variable opacity window 15 in an otherwise opaque enclosure 16, it has been designated 30. In this embodiment of the invention, a PTCR resistor 35 is connected in series with photocell 30. Resistor 35 is completely enclosed within a casing 36 of heat insulating material as shown in broken lines.

With this arrangement, PTCR resistor 35 will have a memory for its previous condition extending over a substantial duration or over a long term. More particularly resistor 35 will remember, or will have a resistance proportional to, the history of the current flow through it. During daylight hours, the resistance of photocell 30 is very low due to the relatively high ambient light levels or light conditions. The resulting high current flow through the control circuit heats the resistor 35 and thus increases its resistance significantly. In the evening, the level or condition of the ambient light decreases quite rapidly, and resistor 35, having been heated all day, provides a high resistance in series with photocell 30. The control circuit thus is desensitized and relay 25 is deenergized or drops out earlier than normal or earlier than it would without the heated resistor 35 in series with photocell 30.

During the night hours, the current through photocell 30 is substantially zero and PTCR resistor 35 cools down. This decreases its resistance and increases the sensitivity of the series circuit including photocell 30, resistor 35 and relay 25.

Relay 25 is thus transferred earlier to turn-off the artificial illumination with the approach of morning light levels. By using a thermal time constant of several minutes or several hours, excellent stability and a close differential are obtained at very reasonable cost and with simple and reliable components.

As an alternative to the embodiment shown in FIG. 3, a mass of metal having a high heat storage capacity can be placed within the heat insulating casing 36 in heat transfer relation with positive temperature coefficient resistor 35. For example, a block of aluminum or the like could be placed within heat insulating casing 36 in heat transfer relation to resistance 35. This will increase even further the thermal time constant of the arrangement. This particular arrangement has not been illustrated in the drawings as it is believed clear, without illustration in the drawings, how it would be arranged.

Figure 4:
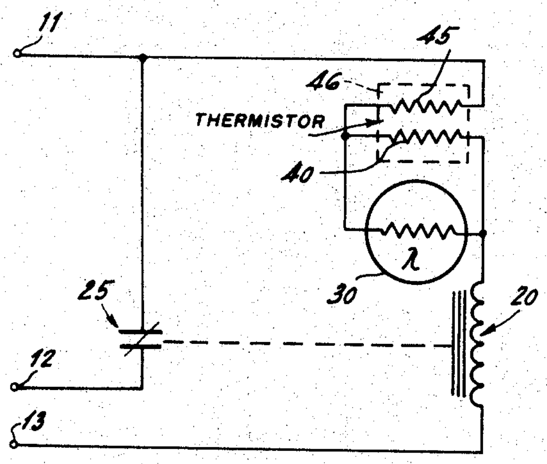

FIG. 4 illustrates an arrangement in which an indirectly heated thermistor is used to obtain the objectives of the invention. Referring to FIG. 4, a thermistor 40 is connected in shunt with the photo-resistance cell 30. A heating resistor 45 is disposed in heat transfer relation with thermistor 40 and is connected in series with photoresistance cell 30. Thermistor 40 and its associated heating resistor 45 are enclosed within a casing 46 of heat insulating material. The other connections are the same as those set forth for FIGS. 1 and 3.

As is known to those skilled in the art, a thermistor has a negative temperature coefficient of resistivity. In other words, the higher the temperature of the thermistor, the lower is its resistance, and vice versa. During daylight, when photo-resistance cell 30 is substantially fully conductive, there is a substantial current flow therethrough and through the heating resistor 45. This heats thermistor 40 to a very substantial extent, and correspondingly raises its temperature and reduces its resistance. This reduced resistance is that in shunt with the photoresistance cell 30. As there is a low resistance path in shunt with photo-resistance cell 30, and as the resistance of this path, which includes the thermistor 40, is a function of the time during which the thermistor has been subjected to heating by resistor 45, and thus a function of the time during which the light level upon photo-resistance cell 30 has been at a relatively high level or condition, the system is desensitized and relay 20 will drop out or become deenergized to turn-on the artificial illumination sooner than normal. Correspondingly, during night time there is substantially no current flow through resistor 45 as photo-resistance cell 30 has a very high resistance. Consequently, thermistor 40 cools off very substantially and has a very large drop in temperature with the drop corresponding substantially to the number of hours or duration of night time. The greatly increased resistance in the shunt circuit around photoresistance cell 30 increases the sensitivity of the series circuit including photocell 30 so that the lights will be turned off, due to transfer or pickup of relay 20, at an earlier time in the morning.

Figure 5:
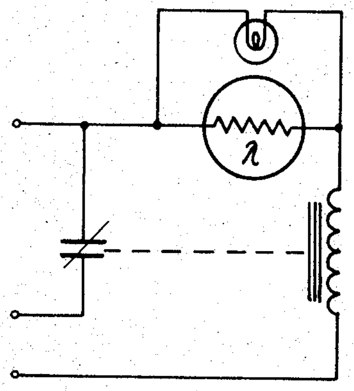

FIG. 5 illustrates an arrangement in which there is light feedback to the photo-resistance cell 30 during hours when the light level incident upon the photo-resistance cell 30 is at a relatively low value or condition. In FIG. 5 a suitable lamp, such as either an incandescent lamp or a gaseous conduction lamp, 50 is connected in shunt with cell 30. During daytime hours, the high conductivity of cell 30 results in substantially no current flow through lamp 50 and thus substantially no effective illumination therefrom. However, when the light level on cell 30 drops to a low value or condition, as at the approach of night time, the photocell 30 becomes a high resistance and drops the relay 20 to turn on the artificial illumination. Correspondingly, there is a flow of current through lamp 50 which is in shunt with cell 30, so that the latter becomes effectively illuminated although the current flow therethrough is insufficient to energize relay 20. This light is incident upon the photo-resistance cell 30. Thus, as morning approaches, only a small light differential is needed to trigger photo-resistance cell 30 sufficiently conductive to transfer relay 20 and turn-off the artificial illumination. The sensitivity to turn-on the artificial illumination is greatly increased by the arrangement shown in FIG. 5 which, in effect, amounts to a light feedback to photo-resistance cell 30.

While specific embodiments of the invention have been shown and described in detail to illustrate the application of the principles of the invention, it will be understood that the invention may be embodied otherwise without departing from such principles.

What is claimed is:

1. In an ambient light responsive circuit, a photo sensitive call effecting energization of said circuit responsive to a first ambient light level, and de-energization of said circuit responsive to a second ambient light level; and means operatively associated with said cell and controlling the sensitivity of response thereof to a change in ambient light levels by modulating energy supplied to said cell; said means having an energy modulating effect which varies as a function of the duration of an immediately preceding ambient light level of substantial duration.

2. An ambient light-responsive control circuit comprising, in combination, a photo sensitive cell; switch means in operative circuit connection with said photo sensitive cell; said cell effecting closure of said switch means responsive to one level of ambient light incident upon said cell and opening of said switch means responsive to another level of ambient light incident upon said cell; and means operable to reduce the differential between the respective ambient light levels effecting closing and opening of said switch means, said differential reducing means comprising means operatively associated with said cell and controlling the sensitivity of response of the latter by modulating energy supplied to said cell; said means having an energy modulating effect which varies as a function of the duration of an immediately preceding ambient light level of substantial duration; said means decreasing the sensitivity of response of said cell with respect to a change from one level of ambient light effecting operation of said switch means while increasing the sensitivity of response of said cell with respect to the other level of ambient light effecting operation of said switch means.

3. In an ambient light-responsive circuit, a photo sensitive cell controlling effective energization of said circuit responsive to changes in ambient light levels; and light transmitting means positioned in the path of light rays incident upon said photo sensitive cell, said light transmitting means comprising a reversible light sensitive material having an opacity varying in accordance with the level and duration of light passing therethrough.

4. In an ambient light-responsive circuit, a photo sensitive cell controlling effective energization of said circuit responsive to changes in ambient light level; and light transmitting means positioned in the path of light rays incident upon said photo sensitive cell, said light transmitting means comprising a material of variable opacity and whose opacity is a function of its immediately preceding light history.

5. In an ambient light-responsive circuit, light transmission means as claimed in claim 4, in which the material of said light transmission means is selected from the group consisting of chlorophyl material, sulphuric acid solutions of ammonium molybdate with organic substances, molybdic acid, formic acid, ammonium molybdate treated with methanol, ammonium molybdate treated with ethanol, molybdic acid oxalate, molybdic acid formate, $WO_3$ dispersed on cellulose, $MoO_3$ dispersed on cellulose, molybdenum, tungsten and chromium hexacarbonyls in methyl methacrylate polymers, and silver halides.

6. In an ambient light-responsive circuit, as claimed in claim 4, a housing of opaque material enclosing said photo sensitive cell; said light transmission means comprising a light transmission window in said housing.

7. An ambient light-responsive control circuit comprising, in combination, a photo-resistance cell; switch means in operative circuit connection with said cell and switched to an on position responsive to one level of ambient light incident upon said cell and to an off position responsive to another level of ambient light incident upon said cell; a resistor in series with said photo-resistance cell and having a positive temperature coefficient of resistivity, whereby the effective series resistance of said resistor is a function of the electric current flow therethrough and thus of the duration of conductivity of said photo-resistance cell responsive to an effective level of ambient light incident thereupon.

8. An ambient light-responsive circuit as claimed in claim 7, including a casing of heat insulating material enclosing said resistor.

9. An ambient light-responsive circuit as claimed in claim 8, including a mass of metal having a high heat storage capacity enclosed within said casing and in heat transfer relation with said resistor.

10. An ambient light-responsive circuit comprising, in combination, a photo-resistance cell; switch means in operative circuit relation with said photocell said switch means, responsive to a change in the ambient light incident upon said photocell from a first light level to a second light level being operated to an open position and responsive to a change in such ambient light from said second light level to said first light level, being operated to a closed position; a thermistor, having a negative temperature coefficient of resistivity, connected in shunt with said photo-resistance cell; and a heating resistor in series circuit relation with said photocell and in heat transfer relation with said thermistor, whereby to heat the latter as a function of the current in said circuit which is, in turn, a function of the ambient light incident upon said photo-resistance cell.

11. An ambient light-responsive circuit, as claimed in claim 10, including a casing of heat insulating material enclosing said thermistor and said heating resistor.

12. An ambient light-responsive circuit comprising, in combination, a photo-resistance cell; switch means in operative circuit connection with said photocell and operable to a closed condition, when the light level incident upon said photocell is at a first level, and to an opened position when the ambient light incident upon said photo-resistance cell is at a second level; and a lamp connected in shunt with said photo-resistance cell and effective, when energized, to direct light thereupon; whereby said lamp will be ineffectively energized when said photo-resistance cell is conductive with a high level of ambient light thereon and will be effectively energized when said photocell is substantially non-conductive with a low level of ambient light thereon.

References Cited

UNITED STATES PATENTS

| | | | |
|---|---|---|---|
| Re. 19,199 | 6/1934 | Knowles | 250—206 X |
| 2,123,470 | 7/1938 | Lamb | 250—206 X |
| 2,875,348 | 2/1959 | Kazan | 250—296 |
| 3,056,035 | 9/1962 | Bernheim | 250—239 |
| 3,151,280 | 9/1964 | Naylor | 317—124 |
| 3,264,466 | 8/1966 | Bacon | 250—239 X |
| 3,270,638 | 9/1966 | Anwyl et al. | 88—106 |
| 3,275,832 | 9/1966 | Curtin | 250—206 |

OTHER REFERENCES

Electronics, Jan. 31, 1964, pp. 42, 43.

RALPH G. NILSON, *Primary Examiner.*

M. A. LEAVITT, *Assistant Examiner.*